(12) United States Patent
Dai et al.

(10) Patent No.: US 8,611,406 B2
(45) Date of Patent: Dec. 17, 2013

(54) SYSTEM OPTIMIZATION USING SOFT RECEIVER MASKING TECHNIQUE

(75) Inventors: Xingdong Dai, Whitehall, PA (US); Max J. Olsen, Mertztown, PA (US); Scott A. Werner, Wernersville, PA (US); Geoffrey Zhang, Allentown, PA (US)

(73) Assignee: LSI Corporation, San Jose, CA (US)

( * ) Notice: Subject to any disclaimer, the term of this patent is extended or adjusted under 35 U.S.C. 154(b) by 1149 days.

(21) Appl. No.: 12/494,805

(22) Filed: Jun. 30, 2009

(65) Prior Publication Data
US 2010/0329319 A1    Dec. 30, 2010

(51) Int. Cl.
*H04B 3/46*    (2006.01)
*H04B 17/00*    (2006.01)
*H04Q 1/20*    (2006.01)

(52) U.S. Cl.
USPC ................................................ 375/224

(58) Field of Classification Search
USPC ................................................ 375/224
See application file for complete search history.

(56) References Cited

U.S. PATENT DOCUMENTS

| | | | | |
|---|---|---|---|---|
| 5,774,242 | A * | 6/1998 | O'Sullivan et al. | 398/29 |
| 7,181,146 | B1 * | 2/2007 | Yorks | 398/195 |
| 7,693,691 | B1 * | 4/2010 | Tao et al. | 703/2 |
| 2003/0128021 | A1 * | 7/2003 | Tan et al. | 324/121 E |
| 2003/0165259 | A1 * | 9/2003 | Balent et al. | 382/113 |
| 2004/0120407 | A1 * | 6/2004 | Searles et al. | 375/259 |
| 2004/0213334 | A1 * | 10/2004 | Ledvina et al. | 375/150 |
| 2006/0146924 | A1 * | 7/2006 | Smith et al. | 375/226 |
| 2007/0018194 | A1 | 1/2007 | Miki et al. | |
| 2007/0018637 | A1 * | 1/2007 | Kim et al. | 324/158.1 |
| 2008/0195363 | A1 * | 8/2008 | Lytollis | 703/3 |
| 2008/0226288 | A1 * | 9/2008 | Miller | 398/9 |
| 2011/0222594 | A1 * | 9/2011 | Zerbe et al. | 375/233 |

OTHER PUBLICATIONS

U.S. Appl. No. 12/178,301 filed in the name of X. Dai et al. on Jul. 23, 2008 and entitled "Methods and Apparatus for Joint Adaptation of Transmitter Transversal Filter in Communication Devices," 20 pages.
U.S. Appl. No. 12/467,507 filed in the name of X. Dai et al. on May 18, 2009 and entitled "Method and Apparatus for Estimating Value of Information Technology Service Management Based on Process Complexity Analysis," 31 pages.
T.H. Lee et al., "Oscillator Phase Noise: A Tutorial," IEEE Journal of Solid-State Circuits, Mar. 2000, pp. 326-336, vol. 35, No. 3.
"Clock (CLK) Jitter and Phase Noise Conversion," Maxim Application Note 3359, Sep. 23, 2004, 9 pages.

* cited by examiner

*Primary Examiner* — Erin File
(74) *Attorney, Agent, or Firm* — Ryan, Mason & Lewis, LLP

(57) ABSTRACT

Communication system optimization using a soft receiver masking technique is disclosed. For example, a method for testing a communication device comprises obtaining a software representation of a receiver portion of a given communication device. A data signal received from a transmitter through a given link channel is then processed, wherein the processing step is performed using the software representation of the receiver portion of the communication device. An output signal is caused to be generated by the software representation of the receiver portion. An eye mask test is then applied to the output signal. Based on a result of the eye mask test, one or more parameters of the transmitter may be adjusted.

27 Claims, 16 Drawing Sheets

| LINE CARD | | BACKPLANE | | | TOTAL LENGTH |
|---|---|---|---|---|---|
| LENGTH | MATERIAL | LENGTH | MATERIAL | STUB | |
| 6" (152mm) | NELCO 4000 13 | 10" (254mm) | NELCO 4000 13 | TOP LAYER (WITH STUB) | 22" (558mm) |

SOURCE: CHANNELS FOR CONSIDERATION BY SIGNALING
Ad Hoc, IEEE P802.3ap, SEPT 17, 2004.

SYSTEM OPTIMIZATION USING SOFT RECEIVER MASKING TECHNIQUE

FIELD OF THE INVENTION

The present invention relates generally to communication systems, and more particularly to system optimization using a soft receiver masking technique.

BACKGROUND OF THE INVENTION

In communication systems, the evolvement of backplanes from bus-based architectures to fabric/mesh-based architectures has fueled rapid deployment of multi-gigabit serializer and de-serializer (SerDes) devices. The variations of backplane channels have greatly complicated the task of system optimization and performance tuning. This is especially true on networking and storage equipment with high channel count.

It has been shown that adjacent channels can have very different frequency responses due to channel variances such as, for example, layer connection, manufacturing, environmental elements and source and load termination interaction. It is therefore evident that for a given SerDes device, a common equalization setting will not work on all different backplanes, with or without process, voltage and temperature (PVT) variations.

Therefore, a systematic way of exploring design space is required to ensure one or more given performance goals are met and/or exceeded (optimized).

SUMMARY OF THE INVENTION

Illustrative embodiments of the present invention meet the above-noted need by providing system optimization using a soft receiver masking technique.

In accordance with one broad aspect of the invention, a method for testing a communication device comprises obtaining a software representation of a receiver portion of a given communication device. A data signal received from a transmitter through a given link channel is then processed, wherein the processing step is performed using the software representation of the receiver portion of the communication device. An output signal is caused to be generated by the software representation of the receiver portion. An eye mask test is then applied to the output signal. Based on a result of the eye mask test, one or more parameters of the transmitter may be adjusted.

These and other objects, features, and advantages of the present invention will become apparent from the following detailed description of illustrative embodiments thereof, which is to be read in connection with the accompanying drawings.

DETAILED DESCRIPTION OF THE INVENTION

The invention will be illustrated herein in conjunction with exemplary communication systems, receivers and receiver components. It should be understood, however, that the invention is more generally applicable to other types of communication systems and receivers, and may be implemented using other receiver component arrangements. For example, the techniques disclosed herein can be adapted in a straightforward manner for use in any communication system comprising one or more serial links in which it is desirable to provide improved system optimization and design space exploration so as to facilitate operation of communication systems at high data rates.

Before describing principles of the present invention and issues that have motivated their creation, a general description of a portion of a communication system with which one or more of such inventive principles may be implemented is now given.

Figure 1:
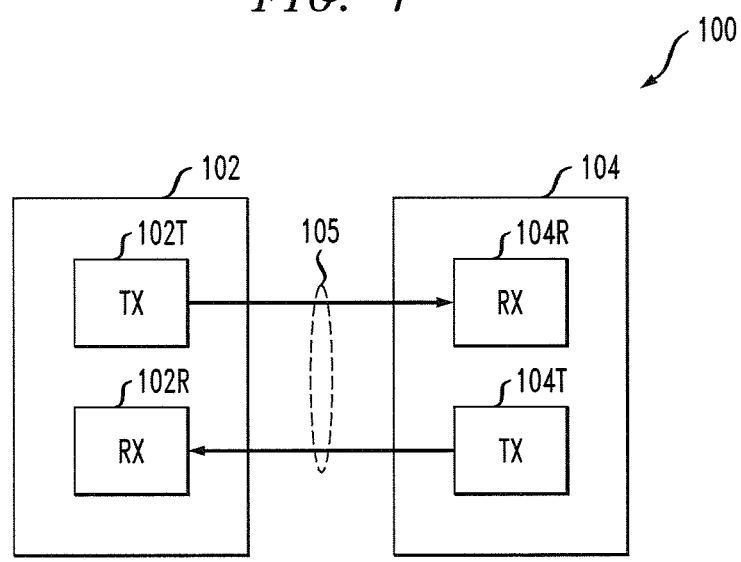
FIG. 1 shows a communication system in which principles of the invention may be implemented.

FIG. 1 shows a portion of such a communication system 100. The system 100 comprises a first node 102 and a second node 104. The two nodes are connected by a bidirectional serial data channel transmission medium 105, also referred to herein as a "link." The first node 102 comprises a transmitter 102T configured for communication with a receiver 104R of the second node 104, and further comprises a receiver 102R configured for communication with a transmitter 104T of the second node 104.

The nodes 102 and 104 may be configured to communicate over serial link 105 in accordance with a known serial communication standard, such as Fibre Channel. Fibre Channel is an American National Standards Institute (ANSI) standard specifying a bidirectional serial data channel, structured for high performance capability. Physically, the Fibre Channel may be viewed as an interconnection of multiple communication points, called N_Ports, interconnected by a link comprising a switching network, called a fabric, or a point-to-point link. Fibre is a general term used to cover all physical media types supported by the Fibre Channel standard, such as optical fiber, twisted pair, and coaxial cable. Additional details regarding these and other aspects of Fibre Channel can be found in the ANSI Fibre Channel standard documents, including the FC-PH, FC-FS, FC-AL-2, FC-PI, FC-DA, FC-MI and FC-LS documents, all of which are incorporated by reference herein.

It is to be appreciated, however, that principles of the present invention can be implemented in communication systems that include other types of serial links, including, for example, serial links configured in accordance with standards such as InfiniBand, IEEE 1394, PCI-Express, Ethernet, Serial Attached SCSI (SAS), Serial Advanced Technology Attachment (SATA), SONET/SDH, etc.

A given one of the nodes 102 or 104 may be configured to operate as a backplane in an illustrative embodiment of the invention. Such a backplane may be used, for example, to interconnect multiple switches, application-specific integrated circuits (ASICs), hard disk drives (HDDs) or other system elements.

The nodes 102, 104 may be viewed as examples of what are more generally referred to herein as communication devices. Such devices may comprise, for example, a SerDes device of the type previously mentioned herein. That is, in node 102 for example, the transmitter (102T) is considered to be a serializer of a data stream and the receiver (102R) is considered to be a deserializer of a data stream. Thus, while the transmitter and the receiver may operate on different data streams, the device in which they both reside is referred to as a serializer/deserializer (SerDes) device. SerDes devices may be used for a variety of applications, for example, they may be used in storage networks as in data centers, wherein the data can be web pages, financial data, etc.

A given node may comprise or be part of another type of communication device, such as a router, switch, computer, server, etc. Conventional aspects of such communication devices are well known and therefore not described in detail herein.

Although only two nodes are shown in FIG. 1, other embodiments of the invention may include many more nodes, in any desired configuration.

Also, a full duplex arrangement of the type illustrated in FIG. 1 is not a requirement of the present invention. In other embodiments, for example, transmitter 104T may communicate with a receiver in a node other than node 102, or transmitter 102T may communicate with a receiver in a node other than node 104.

Note that receivers 102R and 104R may each comprise equalization circuitry which receives an input serial data stream and processes the data stream to reduce the degrading effects of the channel link. The receiver typically includes additional receiver circuitry, for example, signal processing circuitry, switching circuitry, or other types of conventional circuitry typically found in a communication system receiver. Such conventional circuitry, being well understood by those skilled in the art, will not be described in detail herein.

Also included in the receiver 102R or 104R is a processor (not shown) coupled to a memory (not shown). It is understood that the processor may be coupled to the equalization circuitry and one or more other parts of the additional receiver circuitry (cumulatively referred to as "receiver circuitry").

The memory may be configured to store one or more parameters of the functions performed by such receiver circuitry. Such receiver circuitry may be operated at least in part under control of the processor. The memory may therefore store program code that is executed by the processor to implement at least a portion of an equalization process carried out by the receiver. The memory is an example of what is more generally referred to herein as a computer-readable storage medium or other type of computer program product having computer program code embodied therein, and may comprise, for example, electronic memory such as RAM or ROM, magnetic memory, optical memory, or other types of storage devices in any combination. The processor may comprise a microprocessor, CPU, ASIC, FPGA or other type of processing device, as well as portions or combinations of such devices. In other embodiments, at least a portion of the receiver circuitry may be implemented within the processor. Alternatively, the processor may implement at least a portion of the receiver circuitry. It should therefore be apparent that functions of the receiver circuitry may be implemented using various combinations of hardware, software and firmware.

We now turn to an illustrative description of principles of the present invention.

For signal integrity (SI) analysis of high speed differential serial links such as, for example, links that exist between transmitters and receivers of nodes 102 and 104 in FIG. 1, an eye diagram is often employed as a preferred/intuitive system optimization tool. As is well known with respect to eye diagrams, "eye height" is the eye opening in the amplitude domain and "eye width" relates to the signal timing and jitter. For various industrial standards compliance testing, an eye mask for the transmitter (near-end) and the receiver (far-end) is applied to more easily determine pass and fail conditions, and to ensure interoperability among the products from various vendors. When eye width and eye height are bounded by a mask, any violation of the mask boundary indicates non-compliance.

It has been realized that when the speed of a serial interconnect goes beyond a 6-Gbps data rate, the traditional way of using eye masks at the transmitter (TX) output, and in particular at the receiver (RX) input, no longer works well or ceases to work completely. This is due to the larger channel loss in the high frequency range (e.g., due to skin effect and dielectric loss), which transmitter-side pre-emphasis techniques alone may not be able to overcome. As is well known, pre-emphasis and de-emphasis are two implementations of the TX FIR (finite impulse response) filter. More often, these two terms are used interchangeably. However, in strict terms, they are different in how the waveform is shaped. The goal of pre-/de-emphasis is to boost the high frequency of the transmitted signal (more high frequency amplitude at the TX output), so that after the channel link (modeled as a crude low pass filter), at the receiver input, there is a more equal amplitude of low and high frequencies.

As a result of the above-mentioned channel loss, the eye diagram is either partially closed or completely closed after the channel. Attempting to overcome the channel loss, transmitter pre-/de-emphasis is often increased, which can bring unwanted side effects such as consuming more power, increasing system crosstalk interference at the near end, and/or reducing signal amplitude of low frequency contents. Thus, the overall system performance can be degraded, rather than being improved.

One approach to system optimization is lab characterization. Lab characterization is where samples of the production system are manually tuned to obtain equalization settings for the transmitter and/or the receiver. Tests are usually done with a typical device and under room temperature. The results are then weighted and applied to all production devices. However, a major disadvantage of lab characterization is the repeatability of the characterization results and, more importantly, the reliability of those equalization settings in practical situations. Since the settings are obtained from a controlled lab environment, the PVT variations are only partially taken into account. As such, settings may be sub-optimal and/or result in a marginal bit error rate (BER). The reliability of such equalization settings are important, followed by other performance metrics such as power and cost (macro size).

Furthermore, identifying production-ready settings using lab characterization on selected parts has another key limitation. Because the parts are often randomly selected, and testing conditions are frequently at room temperature (as mentioned above), the settings do not represent the worst case situation that a SerDes device will encounter. To mitigate the adverse effect, a larger number of parts have to be tested at higher costs. Still, again, the PVT effects can not be accounted for. As a result, field deployment is not always a smooth process.

In U.S. patent application Ser. No. 12/178,301, filed Jul. 23, 2008, and entitled "Methods and Apparatus for Joint Adaptation of Transmitter Transversal Filter in Communication Devices," which is commonly assigned herewith and incorporated by reference herein, an adaptation algorithm to control the amount of equalization as well as the transmitter output amplitude is described. As a result, link channel equalization is distributed between the transmitter (TX) and the receiver (RX), overall system power consumption is reduced, and the impact of noise and crosstalk on the received signal is minimized, thus permitting improved signal integrity in the system. This algorithm, however, relies on a handshaking protocol as defined in 10 GBASE-KR. Consequently, the majority of SerDes applications can not benefit from the algorithm. In addition, when equalization load is shared between the TX and the RX, the signal eye diagram at the received input will be partially if not completely closed, thus rendering the traditional eye mask approach useless, thus complicating the pass/fail determination that is the hallmark of eye diagram and eye mask techniques.

An insight into the joint adaptation algorithm is that, in order to maximize the system performance, equalization load needs to be shared between TX pre-emphasis and RX equalization. In particular, the transmitter side pre-emphasis will only be adjusted so that the receiver side equalizers will be able to handle the remaining load. Doing so is effective, efficient and reliable, because it ensures minimum transmitter power and with that lower cross-talk interference in the system. Therefore the key is to find an optimal TX setting that satisfies a particular set of system backplanes and the receiver under all possible PVT conditions. This implies the receiver tested must be able to operate at the worst case condition, and possibly below worst case for added margin.

In accordance with principles of the invention, a method is provided for performing efficient in-situ system optimization based on a soft receiver masking technique. Since this method does not rely on 10 GBASE-KR protocol, it can be extended to all serial bus applications. In one embodiment, the method allows one to quickly explore the design space and establish customizable trade-offs among 3-tuple of TX pre-emphasis, RX equalization and backplane. As a result, equalization is shared between the TX and the RX. The user can knowledgably select the transmitter pre-emphasis that will work best (e.g., low power and low cross-talk interference) with a given backplane across a wide range of receiver settings. It is shown that using this method, performance of some previous cases of closed eye system can be further refined. More importantly, the proposed method allows the equipment vendors to configure system parameters for more efficient and reliable operation. Also, the proposed method extends eye diagram and eye mask for fast and intuitive identification of system performance bottlenecks in applications otherwise difficult to control.

In one or more embodiments, portions of mathematical models of SerDes devices are used. Such mathematical models are matched to a pre-silicon design simulation and post-silicon lab measurements. These models have been built for 6-Gbps to 12-Gbps SerDes devices of various technologies, e.g., TSMC 65 nm and 40 nm CMOS (Complementary metal-oxide-semiconductor) technologies.

Figure 2:
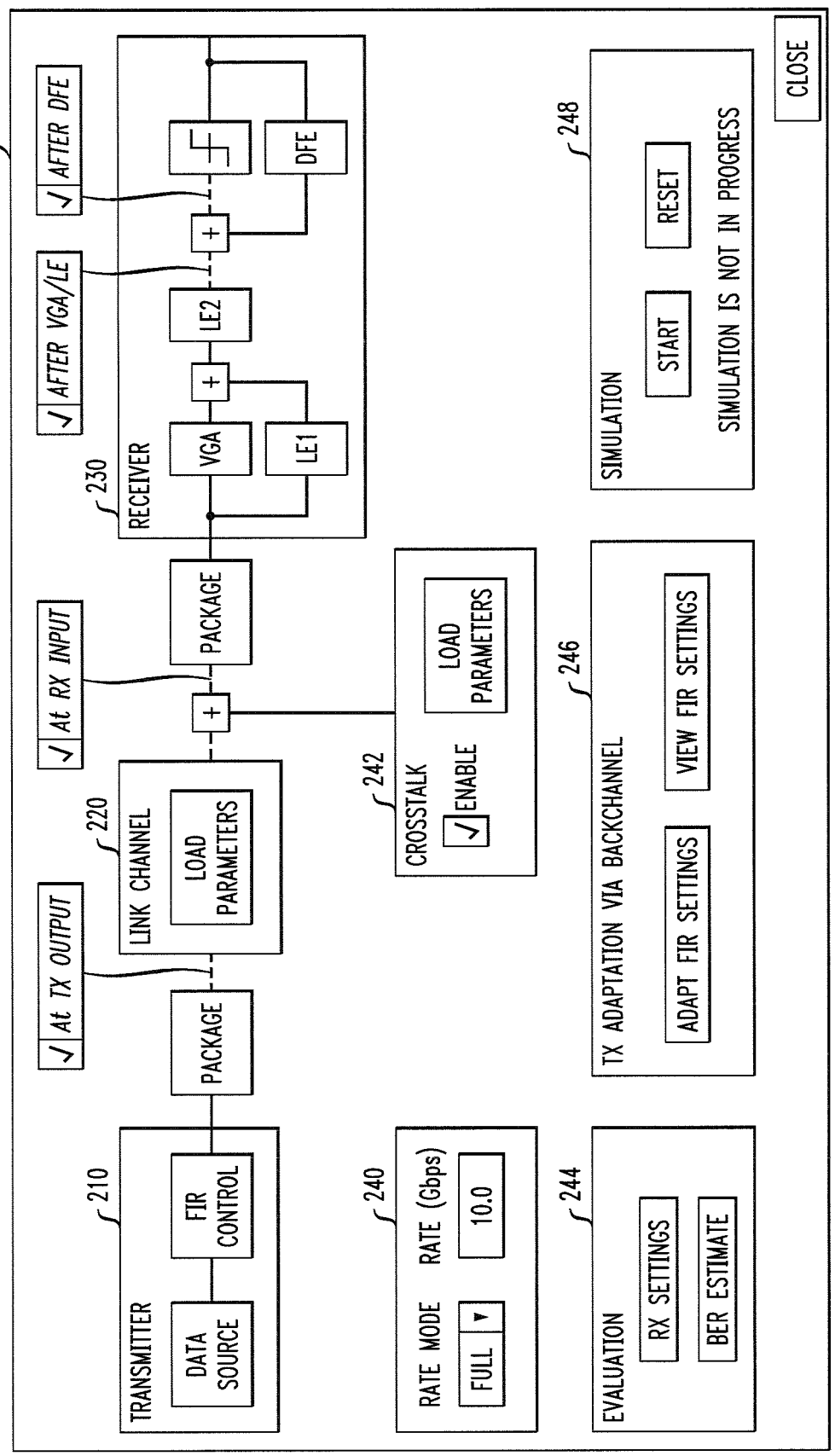
FIG. 2 shows a serializer/deserializer model according to an embodiment of the invention.

FIG. 2 depicts a visualization of a software model developed for an exemplary 12 Gbps SerDes system. For example, the transmitter portion of the model may represent a serializer of one SerDes device and the receiver portion of the model may represent a deserializer of another SerDes device. The SerDes devices that are depicted may represent any known type of SerDes device. However, it is to be understood that the software model can represent the same SerDes device with the output of the serializer (TX part) of a device wrapped around to the input of the deserializer (RX part) of the same device. Such wrap-around may be accomplished with a cable or a backplane. By way of example only, the model may represent known SerDes devices that include the Hyper-PHY™ and GigaBlaze™ families of SerDes devices commercially available from LSI Corporation (Milpitas, Calif.).

The model details the device (i.e., it assumes the test scenario mentioned above where the serializer and deserializer are in the same SerDes device) and block architecture, and was developed in MATLAB. It is known that MATLAB is a numerical computing environment and programming language that is maintained by the MathWorks, Inc. (Natick, Mass.). While a MATLAB mathematical model has been used in this particular embodiment for a particular SerDes device, it is to be understood that principles of the invention are limited to neither the particular type of mathematical model used nor the particular SerDes device that is modeled.

In particular, FIG. 2 shows a visualization of a SerDes device model 200 including a transmitter portion (serializer) 210 with data source and FIR (finite impulse response) control sections, a link channel portion 220 with load parameters, a receiver portion (deserializer) 230 with VGA (variable gain amplifier), LE1 and LE2 (linear equalizers), DFE (decision feedback equalizer), and eye latch array (e.g., a "bang-bang" type utilizing a n-UI sampling arrangement, where UI denotes unit interval and n may be 2, 3, 4, 5, . . . etc.). Also shown are a rate control portion 240, a crosstalk control portion 242, an evaluation control portion 244, a TX adaptation portion 246, and a simulation portion 248.

In accordance with illustrative principles of the invention, we make use of the receiver side (or equalizer portion) of the SerDes model, which we term as the SoftRX (again, denoted as 230 in FIG. 2). Advantageously, the software equalizer of SoftRX can be customized to deliver a percentage of the total receiver equalizer capability. It has been realized that 75% to 85% of the total receiver equalizer capability is adequate for most applications. This not only makes full use of the RX equalizer architecture, but also provides enough room for variation among similar link channels. With use of a software modeled equalizer (SoftRX), the design space that is being optimized is simplified from 3-tuple to 2-tuple comprising the transmitter pre-emphasis and the backplane.

Thus, SoftRX is extracted from the model of FIG. 2 and used for in-place transmitter tuning and system optimization, as will be explained below. That is, FIG. 2 shows a serializer and deserializer simulator model which incorporates a soft receiver implementation. The simulator model has three parts: TX, RX and channel. In one aspect of the invention, given a group of channels, the receiver model is applied to optimally adjust the hardware (real) TX for best system performance or to evaluate the system performance limits. In conventional practice, users are more interested in correcting the TX parameters and simply let receiver blindly adapt. This is because of the lack of a feedback mechanism/protocol. It is realized that appropriate TX settings are important for system performance. Too small an amount or too large an amount of TX pre-emphasis can degrade the system performance. The SoftRX software representation of the receiver provides such a feedback mechanism/protocol.

An illustrative embodiment of a methodology implementing SoftRX will now be described. First, steps of a general flow associated with the methodology are described, followed by steps of the SoftRX flow, then details of eye mask generation and verification.

I. General Flow a. Step 1: Channel Grouping

Link channels exist in many forms. Some commonly used link channels are electrical backplanes such as Tyco Quad backplanes of various lengths (e.g., 2 inch, 16 inch, 30 inch, etc.).

The grouping or binning of link channels can be based on multiple criteria. For example, one can use physical characteristics of the link channels such as length, material type, trace layout, etc. However, this approach may not always be reliable, since electrical characteristics can not be fully captured with a few physical parameters.

Figure 3:
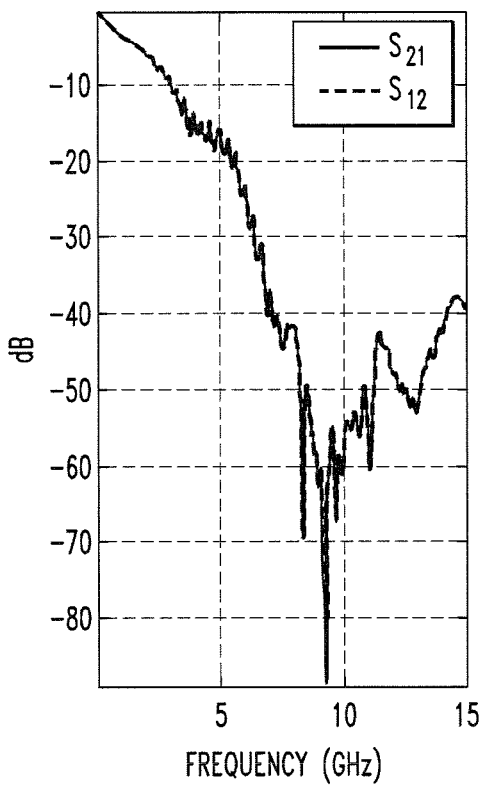
FIG. 3 shows insertion loss and return loss of an exemplary link channel according to an embodiment of the invention.
Figure 3:
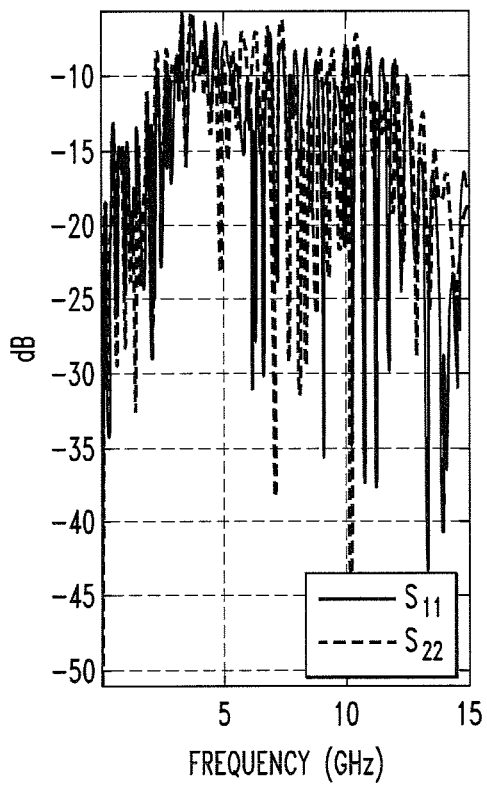

Since link channels can often be approximated as a low pass filter, this insight enables another grouping method based on the frequency domain characteristic of link channels, such as insertion loss (attenuation) and/or return loss (reflection). Insertion loss and return loss can be obtained from scattering parameters (S-parameters) of the link channel, which can be measured with commercial test equipment such as Agilent N5230A PNA-L network analyzer or other types of known vector network analyzers (VNA). Insertion loss and return loss presents a more accurate behavior of the link channels and therefore these frequency domain characteristics are better indicators of a link channel than the physical traits. FIG. 3 shows the frequency behavior of an exemplary link channel (Table 1). $S_{21}$ and $S_{12}$ are insertion loss curves, $S_{11}$ and $S_{22}$ are return loss curves, of the exemplary link channel.

b. Step 2: Transmitter Optimization Space

The transmitter in general has a number of parameters that can be adjusted to optimize system performance. These parameters make up the transmitter optimization space. The most common tunable parameters are: amplitude control, pre-emphasis FIR (finite impulse response) controls comprised of a main-cursor tap weight, one of more post-cursor tap weights, and/or one or more pre-cursor tap weights.

Figure 4:
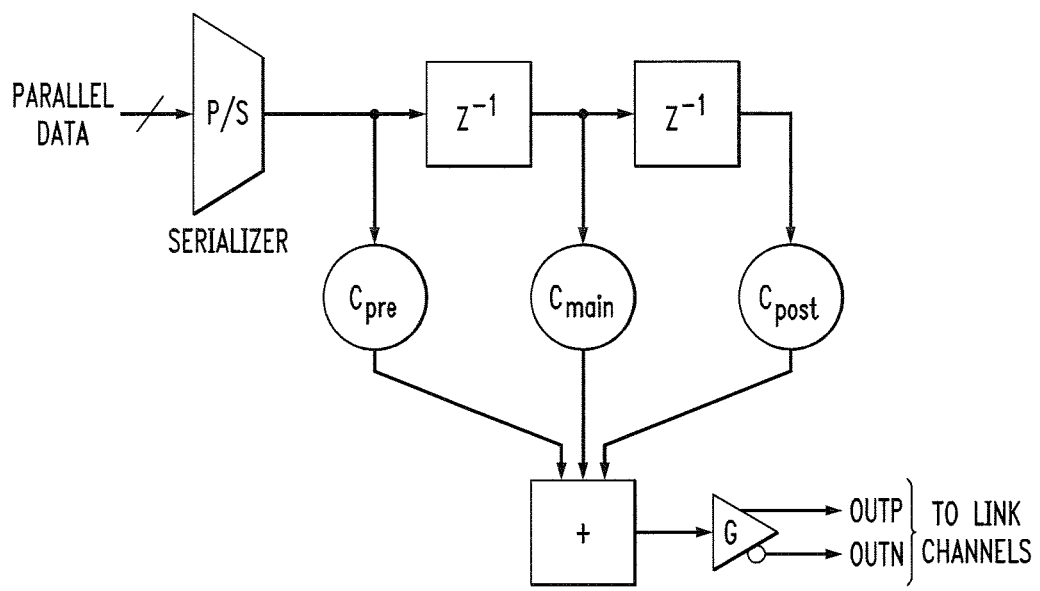
FIG. 4 shows an implementation of a 3-tap transmitter according to an embodiment of the invention.

The actual implementation is design and standard specific, and the number of tunable parameters can vary for different SerDes devices. For example, the 10 G Ethernet standard 802.3ap protocol requires a three-tap FIR design, one for each of a main-cursor, a pre-cursor and a post-cursor. FIG. 4 shows a typical implementation of 3-tap transmitter, where $C_{post}$, $C_{main}$ and $C_{pre}$ are programmable post-cursor, main-cursor and pre-cursor tap weights, respectively, and G is a programmable amplitude control.

Figure 5:
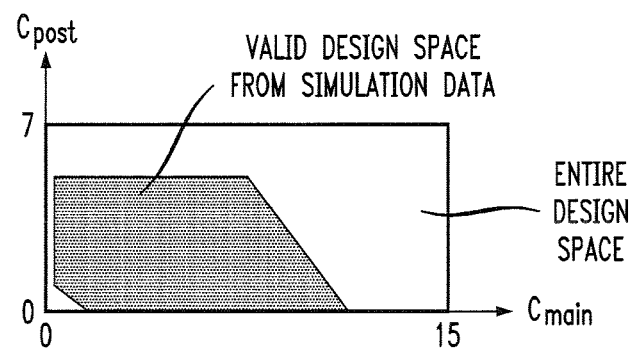
FIG. 5 shows an exemplary two-dimensional design space of a transmitter according to an embodiment of the invention.

For blind adjustment, one can sweep the entire optimization parameter space by testing all combinations of TX adjustable parameters. For example, if the main-cursor tap ($C_{main}$) has a 4-bit value (16-levels) and the post-cursor tap ($C_{post}$) has a 3-bit value (8 levels), then the combined space of the main-cursor and the post-cursor has 128 data points (16× 8). FIG. 5 shows one illustration of a two-dimensional design space. In general, the design space is multi-dimensional with each degree of freedom corresponding to one controllable parameter.

Often, the targeted application standard and/or circuit architecture puts limitations on valid combinations of various parameters. A SerDes circuit will not be able to meet the standard specification, if the parameters are outside a defined range. For example, we may formulate two constraints for the 3-tap TX FIR of FIG. 4:

Maximum output constraint:

$$(|Cmain|+|Cpost|+|Cpre|) \leq \text{Max. Output Amplitude} \quad (G)$$

Minimum output constraint:

$$(|Cmain|-|Cpost|-|Cpre|) \geq \text{Min. Output Amplitude}$$

Maximum output amplitude specifies the outer eye height of the transmitter output signal, while the minimum output amplitude corresponds to the inner eye height. In general, these output amplitudes must conform to a standard such as Fibre Channel electrical specification.

For certain circuit implementations, current source/supply must be budgeted among main-cursor, post-cursor and pre-cursor. Resource sharing will further reduce the number of valid parameter combinations. In other cases, it is realized that certain combinations of the parameters may actually degrade the system performance, rather than improving it.

c. Step 3: Data Capture with Real-Time Oscilloscope.

Figure 6:
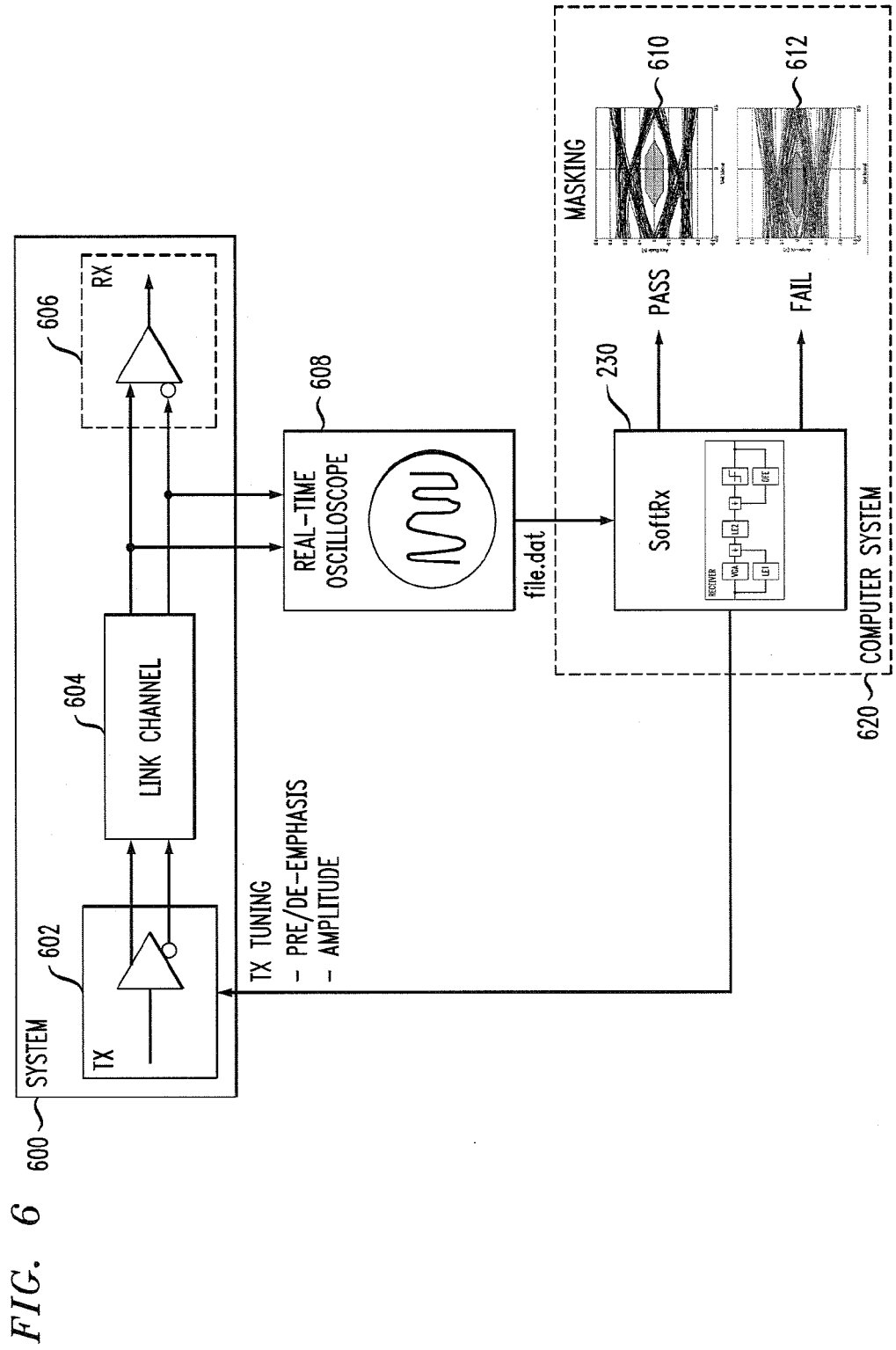
FIG. 6 shows a soft receiver masking methodology for in-place transmitter tuning and system optimization according to an embodiment of the invention.

FIG. 6 shows an illustrative setup for an in-place (in-situ) transmitter optimization and system characterization methodology according to principles of the invention. As shown, such principles are applied to an exemplary communication system 600 with a transmitter 602 coupled via a serial link channel 604 to a receiver 606. It is to be appreciated that the transmitter 602 can be a serializer from a SerDes device different from a SerDes device in which the receiver 606 resides, or both transmitter 602 and receiver 606 may reside in the same SerDes device (as explained above). Also, transmitter 602 may be part of a node in a communication system such as node 102 or node 104 of FIG. 1. Likewise, receiver 606 may be part of a node in the communication system such as node 102 or node 104 of FIG. 1. Also, as mentioned above, serial link channel 604 represents a given link channel selected from a group of link channels. Further, the system optimization process may involve capturing and processing data signals output by each one of the link channels of one or more groups of link channels.

Thus, real time waveforms of the serial data stream signal generated by transmitter 602, obtained after the link channel 604, are sampled and then processed by the software equalizer (SoftRX) 230. This sampling operation can be performed offline, or in real-time (i.e., contemporaneous with the time of receipt of the serial data) directly from a waveform-capture oscilloscope through vendor supplied application programming interface (API). Such a real-time oscilloscope is depicted as 608 in FIG. 6. By way of example only, the Tektronix DSA 72004 20 GHz 50 GSa/s real-time sampling scope can provide a specific number of amplitude data points at a specific sampling interval in a format suitable for the processing code of SoftRX. The sampled serial data is shown as file.dat in FIG. 6, and is input to SoftRX 230 for processing in accordance with the receiver operations that are modeled thereby.

It is understood that software model representing the receiver, i.e., SoftRX, may be executed on a general purpose computer or computing system comprising a processor and a memory. Such a computing system is depicted as 620 in FIG. 6. The memory may therefore store program code that is executed by the processor to implement at least a portion of an equalization process carried out by SoftRX. The memory is an example of what is more generally referred to herein as a computer-readable storage medium or other type of computer program product having computer program code embodied therein, and may comprise, for example, electronic memory such as RAM or ROM, magnetic memory, optical memory, or other types of storage devices in any combination. The processor may comprise a microprocessor, CPU, ASIC, FPGA or other type of processing device, as well as portions or combinations of such devices. It is also assumed that the computing system includes one or more output devices (e.g., display) for viewing the eye diagrams and comparing with eye masks, and one or more input devices (e.g., keyboard, pointing device) for controlling parameters of SoftRX.

For a given channel, the methodology selects a data point in the optimization parameter space of the transmitter 602, and captures the data signal waveform after the link channel 604 with the real-time oscilloscope 608. The captured waveform is saved in a file channel_parameter.dat (file.dat) as a function of voltage (y-axis) and time (x-axis). In general, the TX data pattern is selected to be either a PRBS pattern (PRBS-7 for example) or a standard compliance pattern such as Fibre Channel CJT pattern. In general, the methodology should capture sufficient data bits for post-processing. For example, when a PRBS pattern is used, the preferred capture length is often at least 3 to 4 times the length of the pattern. The capture time is dependent on both the transmit data rate and the number of samples to be captured.

In batch capture mode, the data capture is repeated for all test points in the TX optimization parameter space, and for all channels within the chosen channel group. Each capture creates a separate data file. Once all the data files are created, the methodology proceeds to process this channel group with the soft receiver simulator model (SoftRX 230).

Alternatively, the methodology can process each file with SoftRX as the data samples are captured or the data file becomes available. Some scopes such as Agilent Infinium series permit users to create their own real time signal processing functions with MATLAB. For example, the N5430A user-defined function (UDF) includes customizable linear feedforward equalization (LFE) and real time eye (RTEye) MATLAB programs.

d. Step 4: Optimal TX Setting Discovery with Soft Receiver and Internal Eye Mask.

For each data file, the captured waveform is processed with the SoftRX simulator 230. The processed signal waveform (or data eye) is subsequently compared with an internal eye mask (IEM) to yield pass (610) or fail (612) results. Both SoftRX and IEM are IP specific and the internal eye mask is also influenced by the application and communication standards. The generations of SoftRX and internal eye mask are detailed below in the section II (SoftRX Flow).

Figure 7:
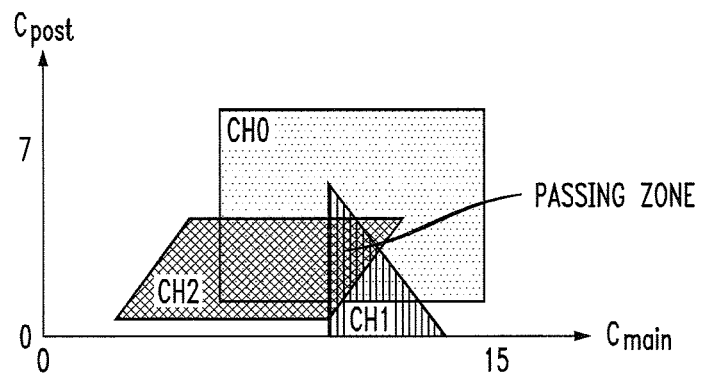
FIG. 7 shows an example of two-dimensional overlay of passing zones for a channel group according to an embodiment of the invention.

The comparison with IEM yields a pass/fail score for a given channel and for a given transmitter setting. For each given channel, the results from all test points generate a passing zone. Passing zones from all channels of the same group are then compared. The settings that satisfy all channels, defines optimal transmitter settings for this channel group. The passing zone is the common space for all selected channels. FIG. 7 shows an illustration on a two-dimensional design space. For multi-dimensional design space, visualization can be a difficult task and the methodology can obtain the passing zone with the aid of a computer program, such as the following code in the Python programming language:

```

# Ch = (Ch[0], Ch[1], ... , Ch[N-1])
# Ch[n] = (Amp, Pre, Main, Post)
# PZ is the passing zone for the channel group
PZ = Ch[0]
for cNum in range(1,N):
    PZ_tmp = [ ]
    for i in range(len(Ch[cNum])):
        if Ch[cNum][i] in PZ:
            PZ_tmp.append(Ch[cNum][i])
    PZ = PZ_tmp
if PZ == [ ]:
    print("Passing Zone is empty.")
elif len(PZ) < minSize:
    print("Passing Zone is too small.")
else:
    print("Passing Zone is identified for this channel group.")

``` e. Step 5: Channel Re-Assignment.

If the passing zone generated by the SoftRX 230 is empty (or too small), then the channel links that deviate most from the rest of channels within the group are re-assigned to other groups or form a new group.

II. SoftRX Flow a. Step 1: Data Re-Sampling

A data file is generated in the general flow step 3 as a function of voltage and time (file.dat). Each NRZ (non-return-to-zero) data bit is over-sampled by the real-time oscilloscope 608. For example, for InfiniBand Quad Data Rate (QDR) application at 10 Gbps, a peak sampling rate of 50 GSample/second will over-sample each unit interval by a factor of five. However, this over-sample ratio may not always be an integer. For example, 6 Gbps Serial Attached SCSI (SAS) application is over-sampled by a ratio of 8.33 (SCSI stands for Small Computer System Interface).

A software processing program such as SoftRX, on the other hand, often has a different requirement on the number of uniformly spaced samples (N) per UI (unit interval). For example, N is 16. Therefore, the scope captured data is re-sampled to match the software requirement. New samples are generated by interpolation methods on scope sampled data samples. Linear interpolation is the most common method, though other interpolation methods may also be used, such as sinc, spline, and quadratic. The re-sampled data is then fed to the soft receiver model SoftRX 230.

b. Step 2: Receiver Simulation Model

It is to be appreciated that the soft receiver model is design and technology dependent. In general, a receiver model can be separated into two parts: passive and active components.

Passive components include package, termination and ESD (electrostatic discharge) circuits that have fixed functionality and require very limited or no adjustments. Passive component models can often be obtained from technology providers. In general, they can be modeled as is. For example, the package can be modeled either as a lumped RLC circuit, or more accurately distributed RLC circuits. In either case, the worst case behavior of the receiver package is used for the soft receiver model.

Active components contains the internal components of receiver analog circuitries such as VGA (gain), LEQ (pole, zero, gain), DFE (tap weights). These controls will be actively adapted for a given application by an adaptation state machine if present. Otherwise, a manual sweep of the receiver design space is applied, similar to that on the transmit side.

All models of passive and active components of the receiver may be extracted from a circuit simulation tool such as SPICE (Simulation Program with Integrated Circuit Emphasis) under worst case PVT. From the SPICE simulation, a frequency behavior model is extracted using AC (alternating current) analysis and is captured in MATLAB. Since circuit topology and design technology differ on each receiver, the models of active components are different as well. In the following, we use the example of an RC-tunable analog linear equalizer implemented in 65 nm TSMC CMOS technology, to illustrate the general modeling process.

MODELING EXAMPLE

An RC-Tunable Analog Linear Equalizer

Figure 8:
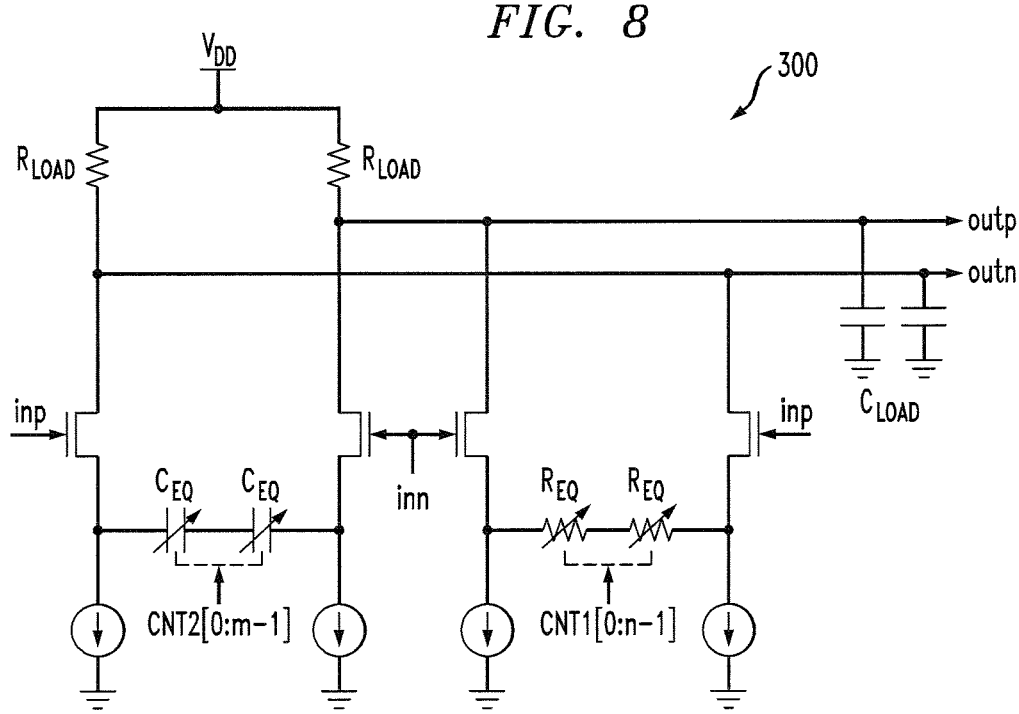
FIG. 8 shows an implementation of an RC-tunable analog linear equalizer according to an embodiment of the invention.
Figure 9:
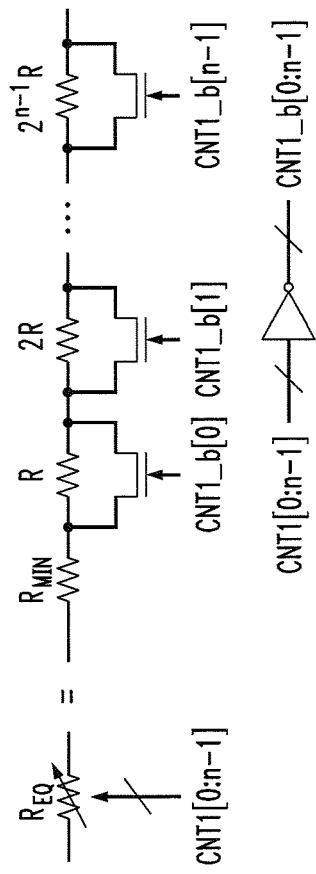
FIG. 9 shows a binary weighted resistor array according to an embodiment of the invention.
Figure 10:
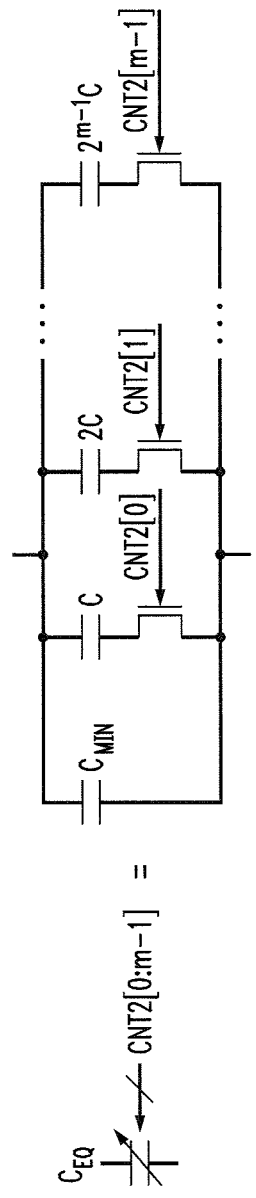
FIG. 10 shows a binary weighted capacitor array according to an embodiment of the invention.

FIG. 8 shows an implementation of an RC-tunable analog linear equalizer which is described in U.S. patent application Ser. No. 12/467,507, filed May 18, 2009, and entitled "Multi-Band Gain Adaptation for Receiver Equalization Using Approximate Frequency Separation," which is commonly assigned herewith and incorporated by reference herein. The design in the above-cited U.S. Patent Application extends the circuit described in U.S. Patent Publication No. 2007/0018194, which is commonly assigned herewith and incorporated by reference herein, by adding a binary weighted resistor array as shown in FIG. 9, while retaining a binary weighted capacitor array as shown in FIG. 10. The transfer function of this circuit can be approximated as:

$$\frac{V_{OUT}}{V_{IN}} = G_{LF} \frac{1 + sR_{EQ}C_{EQ}}{1 + sR_{LOAD}C_{LOAD}}, \quad (1)$$

where $$V_{OUT} = V_{outp} - V_{outn}, \quad (2)$$

$$V_{IN} = V_{inp} - V_{inn}, \quad (3)$$

$$G_{LF} = \frac{R_{LOAD}}{R_{EQ}}. \quad (4)$$

Figure 11:
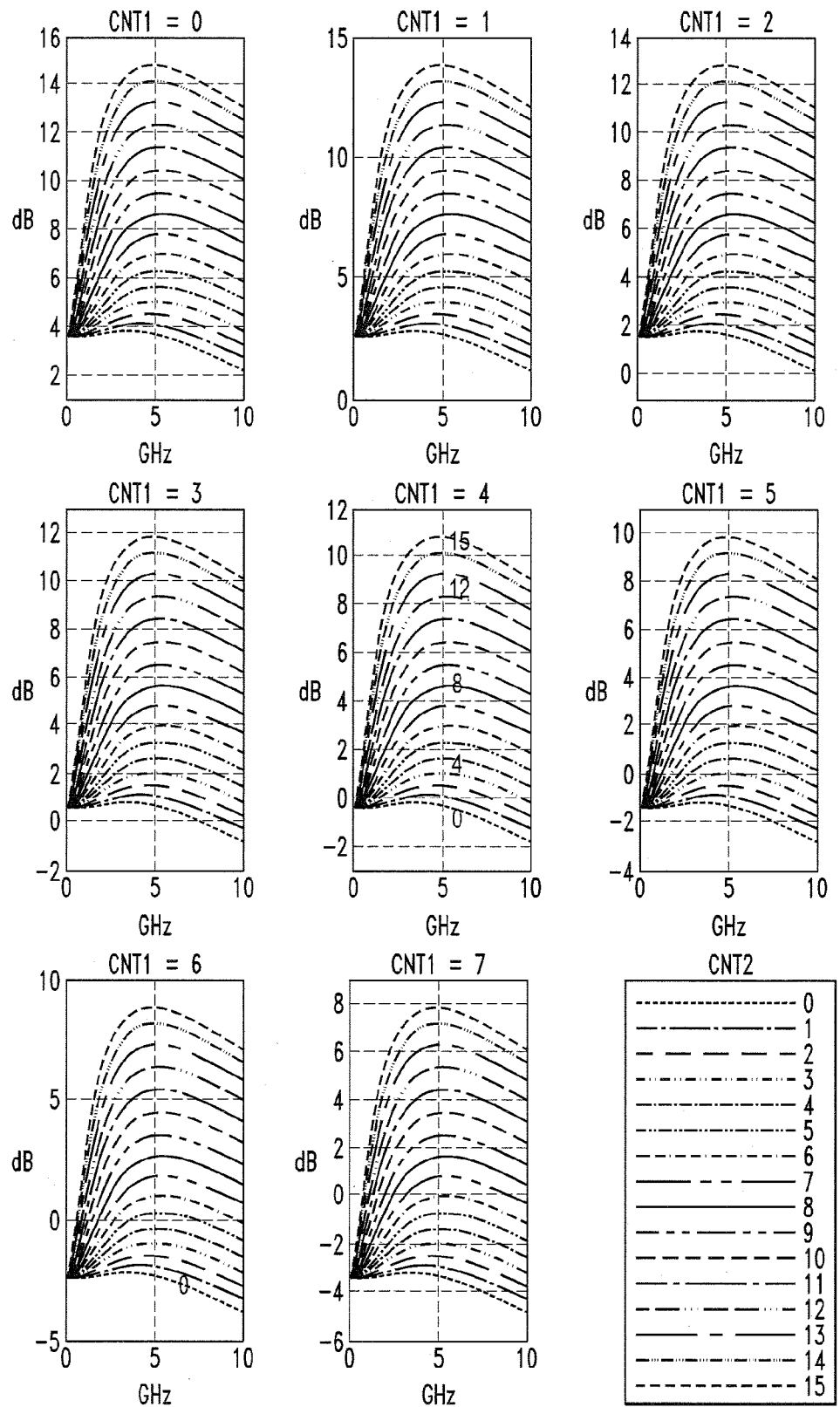
FIG. 11 shows frequency response curves of a wide range RC-tunable analog linear equalizer with 3-bit CNT1 (low frequency) and 4-bit CNT2 (high frequency) according to an embodiment of the invention.

The frequency response is controlled by the zero (adjustable product of $R_{EQ}$ and $C_{EQ}$), and pole (fixed product of $R_{LOAD}$ and $C_{LOAD}$). $G_{LF}$ is the low frequency or DC (direct current) gain of the analog linear equalizer and is tunable through the resistor array ($R_{EQ}$). The frequency response of one realization of this RC-tunable equalizing filter is shown in FIG. 11 with a 3-bit of resistor control and a 4-bit of capacitor control.

The transfer function of equation (1) can be modeled in MATLAB. However, the values of $R_{EQ}$, $C_{EQ}$, $R_{LOAD}$ and $C_{LOAD}$ are all modified to match with the post-layout circuit (SPICE) simulation under worst case PVT conditions.

c. Step 3: Cost Function Minimization

Figure 12:
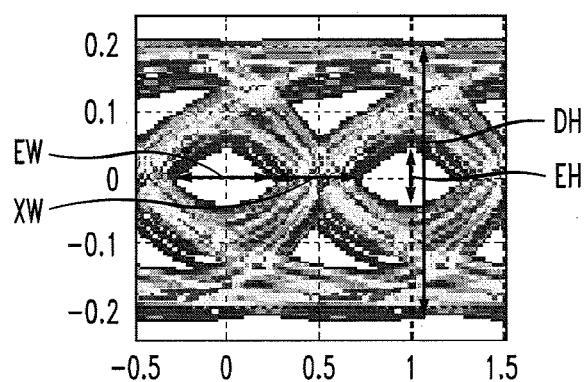
FIG. 12 shows parameters used to quantify the quality of a signal eye according to an embodiment of the invention.

From the scope data file on a given link channel and TX setting, the SoftRX receiver model adapts (or sweeps) its active component controls to reach a pre-defined processing objective. This adaptation goal is to minimize a cost function with respect to a signal eye. A signal eye diagram is generated by overlapping a signaling waveform repeatedly over a one UI interval. For the receiver, the cost function is typically expressed as a measurement on the quality of the signal eye: eye width (EW), edge/crossing width (XW), eye height (EH), eye height ratio, signal to noise ratio (SNR), or a weighted combination. FIG. 12 depicts these parameters on a signal eye diagram, where eye height ratio is obtained as EH/DH, and where DH is the data height or the outer eye height.

Adaptations based on eye width and/or crossing width are considered primarily edge equalization (EE) schemes, while those based on eye height and SNR are mostly center equalization (CE) methods.

d. Step 4: Checking against Internal Eye Mask (IEM)

When the cost function is minimized, either at the end of the adaptation state machine, or by sweeping the receiver design space, the resulting signal waveform is saved and the corresponding post-processing eye diagram is compared against a pre-defined internal eye mask. The internal eye mask ensures that the expected or accepted performance level will be met for a specific application. The generation of IEM is detailed below in section III (Generation of Internal Eye Mask).

If the IEM and the SoftRX processed eye diagram do not overlap, the corresponding set of TX parameters is believed to have a better operating margin (and good performance) for the given backplane. On the transmit design space, this data point will be marked with a green dot. If they do overlap, the eye mask has been violated and the set of TX parameters is believed to have a low operating margin (and possibly sub-optimal performance) for that particular backplane. That data point is marked with a red dot.

When the TX design space is swept, the green dots create an area of the passing zone for a given backplane. For the settings within the passing zone, a better performance can be expected under worst case PVT. Passing zones are further overlapped for all link channels for a given channel group, where the common area defines the set of TX parameters that are expecting good performance. Those settings are documented and provided to the factory (e.g., SerDes manufacturing facility) to be pre-set based on equipment applications and customer requests.

One of the advantages of SoftRX technique is to eliminate blank or incorrect factory pre-sets and to address a frequent customer inquiry for a working TX setting with minimal exploration efforts.

III. Internal Eye Mask a. Generation

The quality of serial data communication is often measured with a bit error ratio (BER) test. Bit error ratio (BER) is defined as the percentage of the received bits in error compared to the total number of bits received over a given period of time. It is sometimes called bit error rate. For many networking systems, including optical networks and storage area networks (SAN), and in a number of interconnect standards such as XFP/XFI, OIF CEI and PCI-Express, the acceptable BER is often required to be less than $1 \times 10^{-12}$ or $1 \times 10^{-15}$. However, any measurement to such levels is impractical due to the extremely long test time. For example, by the most conservative estimate, it will take nearly 28 hours to test $1 \times 10^{15}$ bits at 10-Gbps data rate.

Eye diagrams, on the other hand, provide a much faster mechanism to access the communication system performance. The eye diagram is formed by overlapping digital signal waveforms over a specified time interval, for example, one unit interval (UI). Qualitative assessment of the system performance can be obtained, because much parametric information about the channel links can be extracted out from signal rise/fall time, overshoot or ringing, width/height of eye opening, etc. Careful analysis of this visual display can offer engineers insights into channel impairments such as inter-symbol interference (ISI) and yield a first order approximation of signal-to-noise, clock timing jitter and skew.

An eye mask is often applied in conjunction with the eye diagram. Because of the eye diagram's ability to allow a quick evaluation of the system performance, a number of interconnect standards employ an eye diagram mask of a particular shape and size to ensure interoperability from different system and device vendors. These standards (such as PCI Express) take advantage of the intuitive nature (pass/fail) of the eye mask test and define eye mask specifications at the transmitter output (transmit eye mask) and/or after a compliance test channel (receive eye mask). The eye diagram has been offered as an indispensable feature from most oscilloscope vendors such as Agilent and Synthesis Research Inc. Many physical layer integrated circuit (IC) providers are also beginning to include on-chip eye capture and display as part of serializer and deserializer (SerDes) product offering.

In section I above, General Flow Step 3, a real-time scope is used to sample the transmitted waveform after the link channel. The number of samples are assumed to capture a majority of the deterministic jitter components (DJ) but very little of the random jitter component (RJ). The eye mask provides a mechanism to specify the requirements on jitter and noise components that are difficult to capture in a short period of time relative to the BER test time. Therefore, the eye mask has been used as a common tool to determine whether or not a given implementation is compliant with the specification. For example, signal quality is unacceptable if signal traces cross the mask boundaries. Otherwise, the signal quality is meeting the mask requirements.

Different applications may also specify different requirements on the generation of an eye diagram. For example, the trigger signal is derived from the measured signal through a so-called golden PLL. The PLL bandwidth is commonly specified to be data rate/1667 or data rate/2500. For example, 10 Gbps Ethernet eye-mask tests are specified to be performed with a DCA (digital communication analyzer) trigger using a PLL with a bandwidth of 10.3125 Gbps/2500 or 4.125 MHz. When doing so, the low frequency jitter in the signal is passed onto the trigger signal. As a result, an otherwise failing eye (if a clean clock is used as the trigger) will pass the eye mask template.

Principles of the present invention extend the eye mask concept to inside the receiver, and more specifically at the input of the data sampling latch. The receiver internal eye mask (IEM) is not only application specific but also design specific. IEM is influenced by a number of factors, such as the expected BER performance, deterministic jitter contribution, the clock source (e.g., reference clock and PLL architecture), system noise sources (e.g., sampling latch threshold voltage uncertainty), power supply noises and jitter components such as crosstalk. To construct the internal eye mask, the inventive methodology formulates the random jitter contribution at the measured BER value, on the same two-dimensional plane as the eye diagram.

Figure 13:
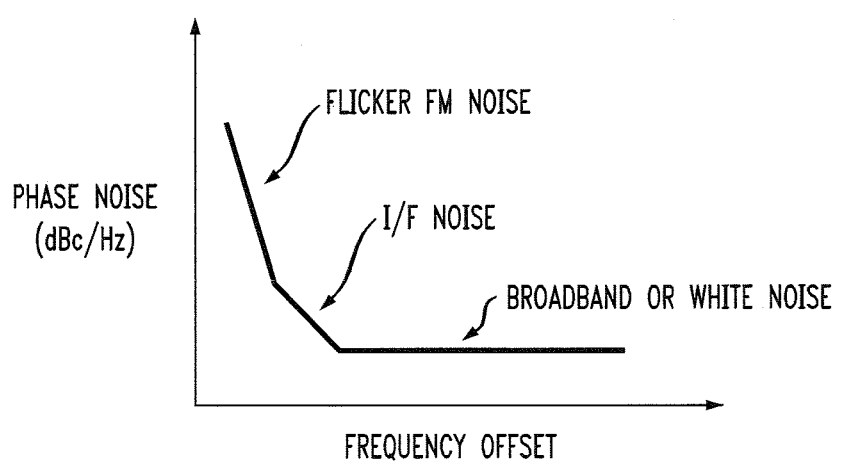
FIG. 13 shows oscillator phase noise according to an embodiment of the invention.

Take clock noise source for example. The reference clock is often generated by an off-chip crystal oscillator whose frequency can vary from 10 MHz to over 200 MHz. The SerDes high speed clock (multi-GHz) is then generated with a phase locked loop (PLL) circuit with respect to the reference clock. The PLL employs either voltage controlled ring oscillator (VCO) or LC oscillator (LCO). All forms of oscillators have phase noises which contribute to timing jitter. Phase noise is expressed as the ratio of signal power to noise power measured in 1 Hz bandwidth at a given offset from the desired signal. FIG. 13 shows a typical phase noise profile. A detailed study can be found in "Oscillator phase noise: a tutorial" by T. Lee and A. Hijimiri, IEEE Journal of Solid-State Circuits, Vol. 35, No. 3, pp. 326-336, March 2000, the disclosure of which is incorporated by reference herein. Once the phase noise is obtained in the frequency domain, it can be converted into timing jitter that will be used later to construct the internal eye mask. A mathematical relationship between phase noise and timing jitter (the conversion) is described in Maxim application notes 3359 "Clock (CLK) jitter and phase noise conversion", Sep. 23, 2004, the disclosure of which is incorporated by reference herein.

Figure 14:
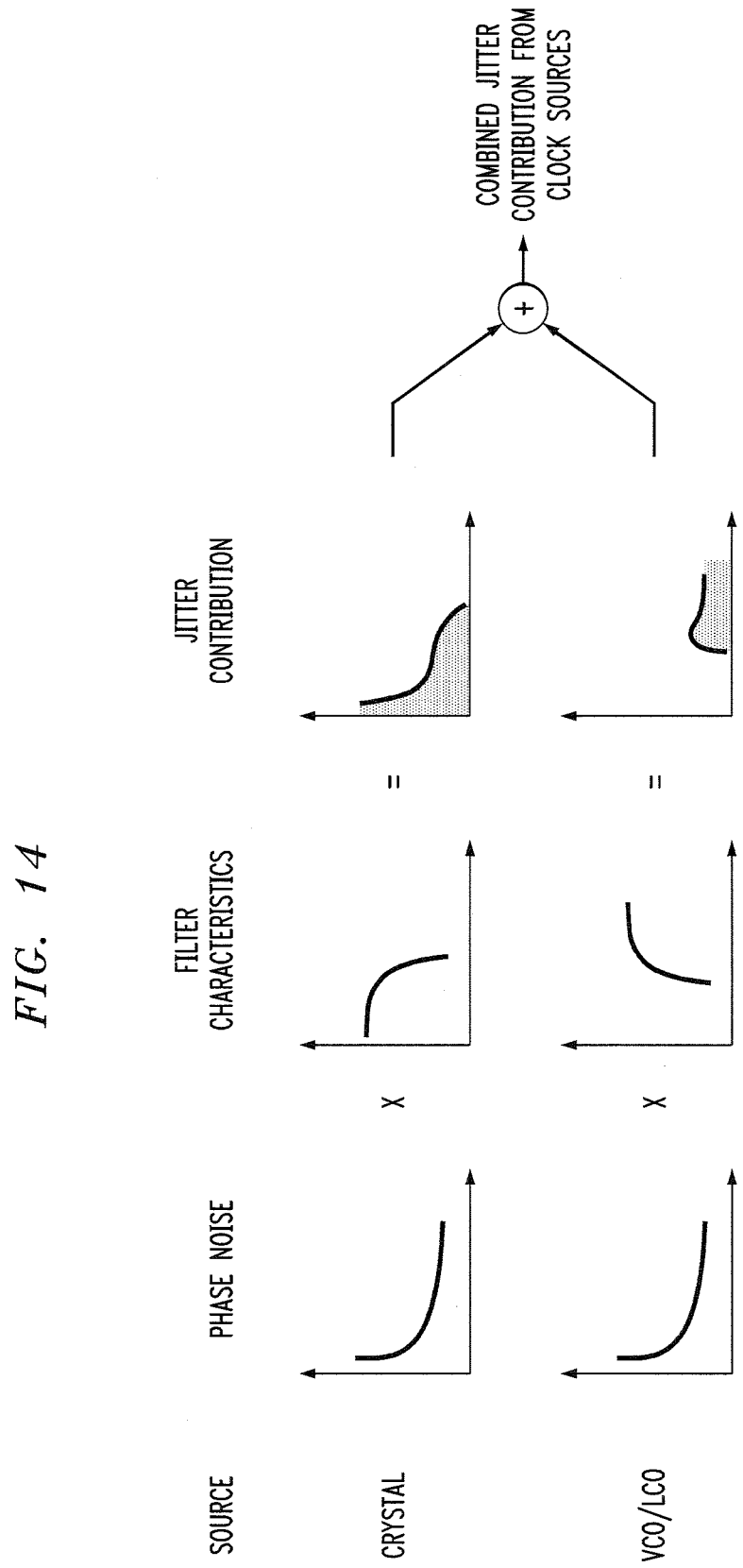
FIG. 14 shows combined jitter contribution from clock sources according to an embodiment of the invention.

For the reference clock, the PLL circuit behaves as a low pass filter. For the VCO or LCO, on the other hand, it is a high pass filter. Therefore, based on circuit simulation, one can sum up the RJ contributions from the clock sources. This is illustrated in FIG. 14.

Figure 15:
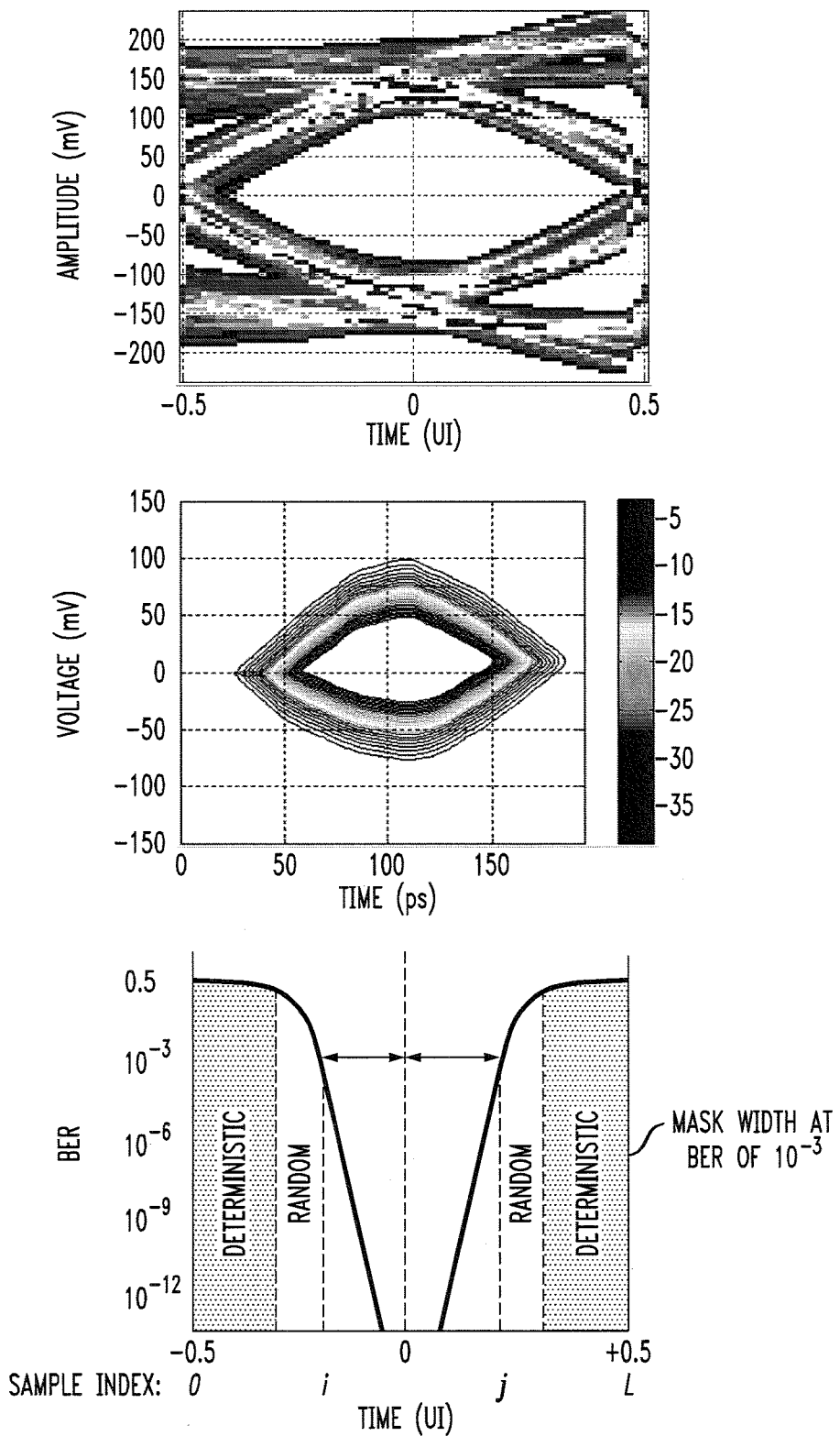
FIG. 15 shows an eye mask width specification according to an embodiment of the invention.

Once all the RJ contributions are calculated, the methodology uses the bath-tub curve to extract the expected eye width at measured BER. This eye width forms the eye mask width at the eye center as shown at bottom of FIG. 15. Also shown are the captured eye diagram (top of FIG. 15) and generated BER contour (center of FIG. 15). Thus, FIG. 15 shows an eye mask width specification in relation to the eye diagram, eye contour and bath tub curve, where i and j are eye width indices for the eye mask, and L is the sample number per UI.

Similarly, the amplitude noise sources can be formulated to obtain an amplitude requirement. It should be noted that some noise sources such as sampling latch threshold uncertainty can affect both timing and amplitude.

Once timing and amplitude width is defined, the four points are linked and a diamond shaped eye mask is formed. This is the simplest internal eye mask. Other more sophisticated eye masks can also be constructed from expected BER contour.

b. Verification

Figure 16:
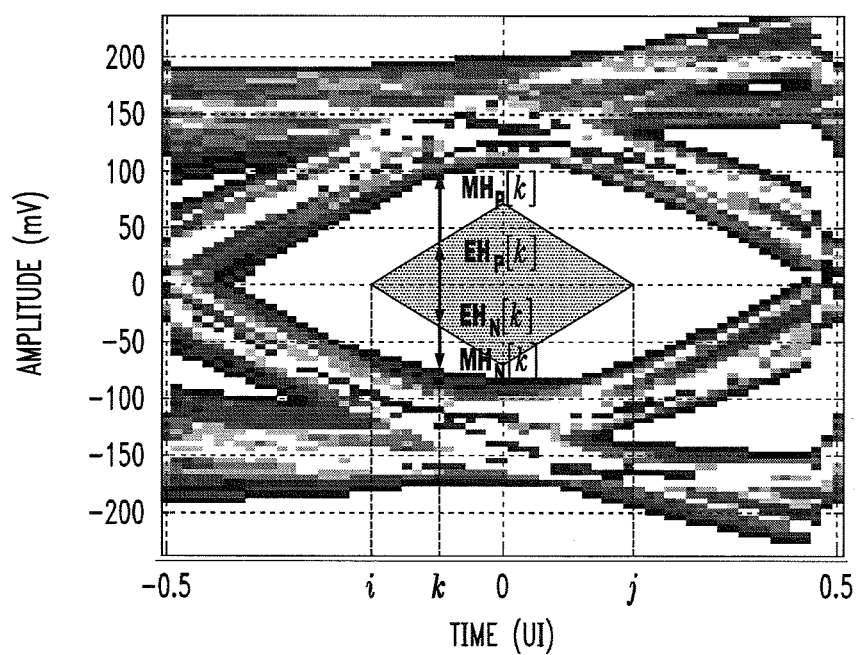
FIG. 16 shows an example of an internal eye mask test according to an embodiment of the invention.
Figure 17:
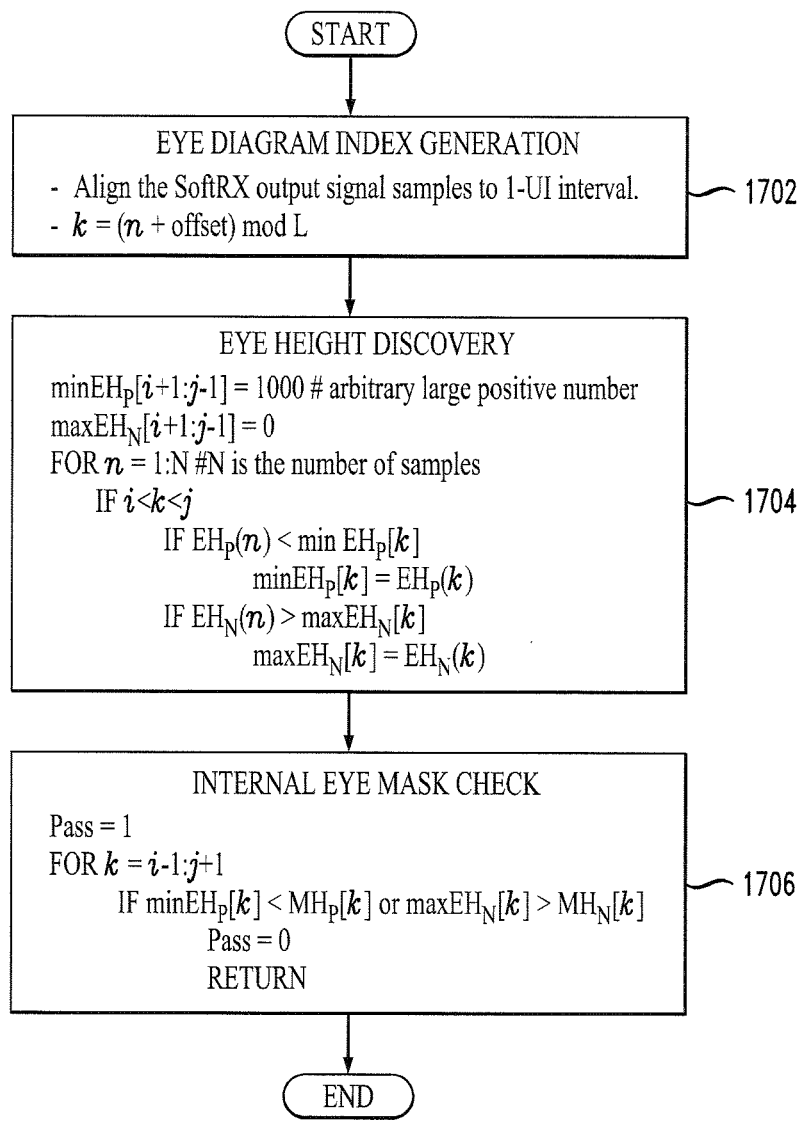
FIG. 17 shows a methodology of an internal eye mask check according to an embodiment of the invention.

An internal eye mask (IEM) test can be performed by fitting the internal eye mask onto the captured eye diagram. The inspection can be performed visually to see if any signal traces have violated the mask boundary. This is demonstrated in FIG. 16. Mathematically, the flow chart in FIG. 17 is used. $EH_P(k)$ is the eye height positive offset above the sampling threshold, $EH_N(k)$ is the eye height negative offset below the sampling threshold, $MH_P(k)$ is the IEM height positive offset above the sampling threshold, and $MH_N(k)$ is the IEM negative height offset below the sampling threshold, measured at UI index k. Using these parameters, an eye diagram index is generated in step 1702, eye height is discovered in step 1704, and the IEM is checked in step 1706.

Accordingly, as explained in the above sections, SoftRX is configured to reflect the worst case across PVT of the receiver design, which is difficult to accomplish in a lab setup. The receiver block models are parameterized, including variable gain amplifier (VGA), analog linear equalizer (ALE), decision feedback equalizer (DFE). For example, the DFE model includes imperfection with quantization noise in tap weights. The SoftRX processed data can then be analyzed with a masking technique as described above.

SoftRX also then provides feedback to the transmitter which uses such feedback to tune its finite impulse response thereby adjusting the pre-emphasis applied to subsequent serial data streams transmitted by the transmitter. For example, assuming a blind application, where a device has not undergone an in-system optimization, a backplane binning method can be adopted. In this case, the application specific link channels are divided into a limited number of groups, say M, where M is usually less than six. The grouping or binning of channel links can be based on one or more physical characteristics of the link such as length, material type, trace layout, etc, or frequency domain characteristics of the link such as insertion loss or return loss, or a combination.

One can pre-determine the optimal TX pre-emphasis and amplitude settings for the M sets of link channels using the soft receiver (SoftRX) masking technique in system. This will substantially guarantee that the product specification is met. For practical system deployment, the methodology selects one setting from these M-preset values by matching the system backplane to the pre-characterized link channels.

Figure 18:
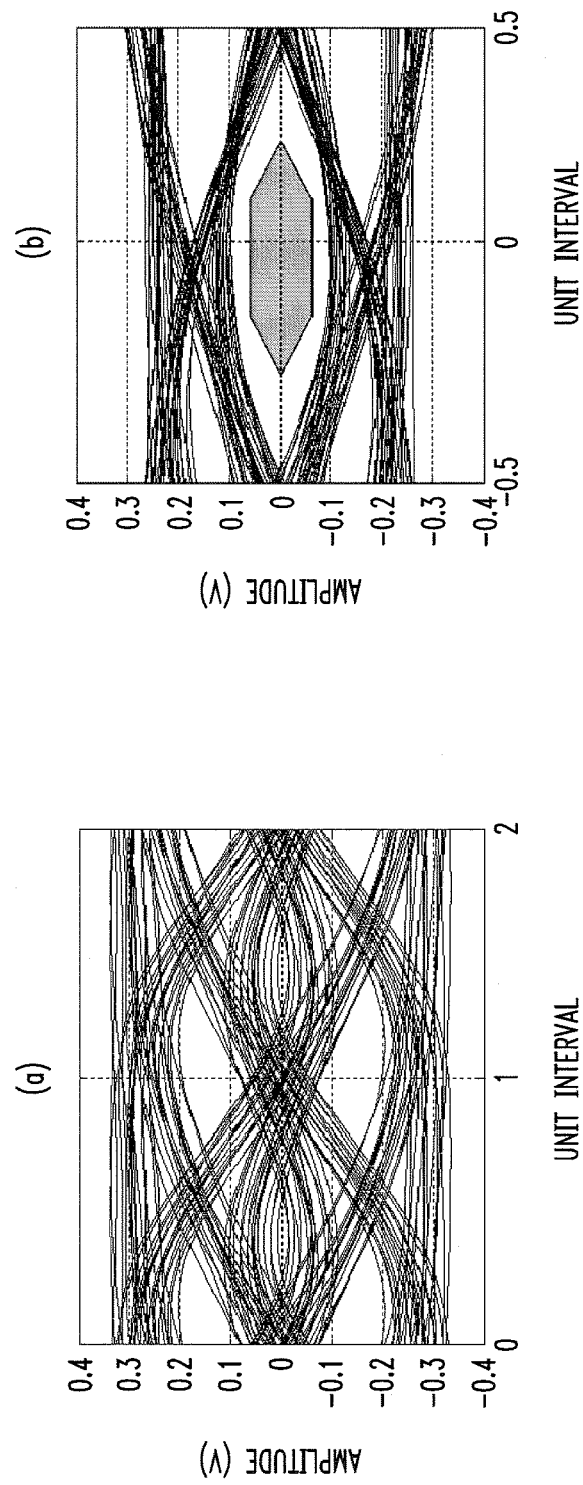
FIG. 18 shows a first eye masking test case according to an embodiment of the invention.

FIG. 18 shows a first eye masking test example. Case #1 assumes a TX setting type #1 and a channel type #1. In this case, the TX setting works very well with this channel group in that: (i) the TX pre-emphasis is programmed just enough for the SoftRX (software equalizer) to open up the eye and meet the RX internal eye mask; and (ii) the TX amplitude and pre-emphasis level makes sure that minimum power is consumed and minimum cross-talk effect is exerted into the system.

Figure 19:
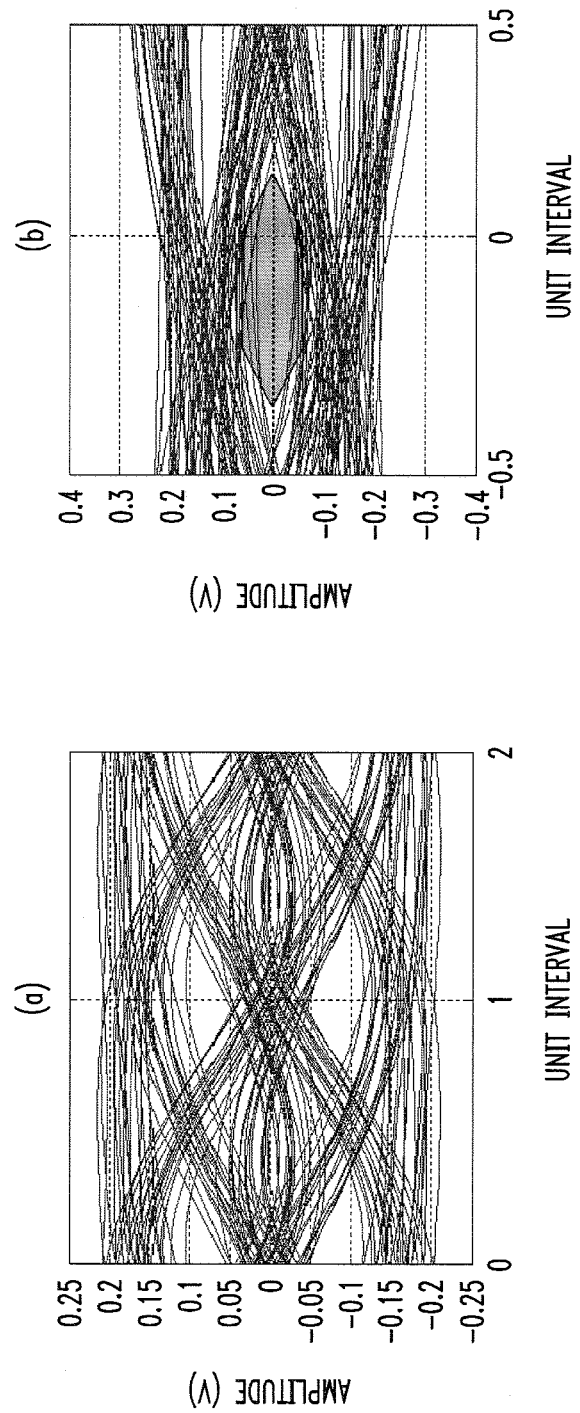
FIG. 19 shows a second eye masking test case according to an embodiment of the invention.

FIG. 19 shows a second eye masking test example. Case #2 assumes a TX setting type #1 and a channel type #2. In this case, the TX setting does not work with a different channel group in that: (i) the TX pre-emphasis programmed does not provide enough equalization and, thus, gives too much burden to the RX side equalizer circuitry; (ii) the SoftRX (software equalizer) can not open up the eye enough to meet the RX internal eye mask; and (iii) a different TX pre-emphasis setting is called for.

Figure 20:
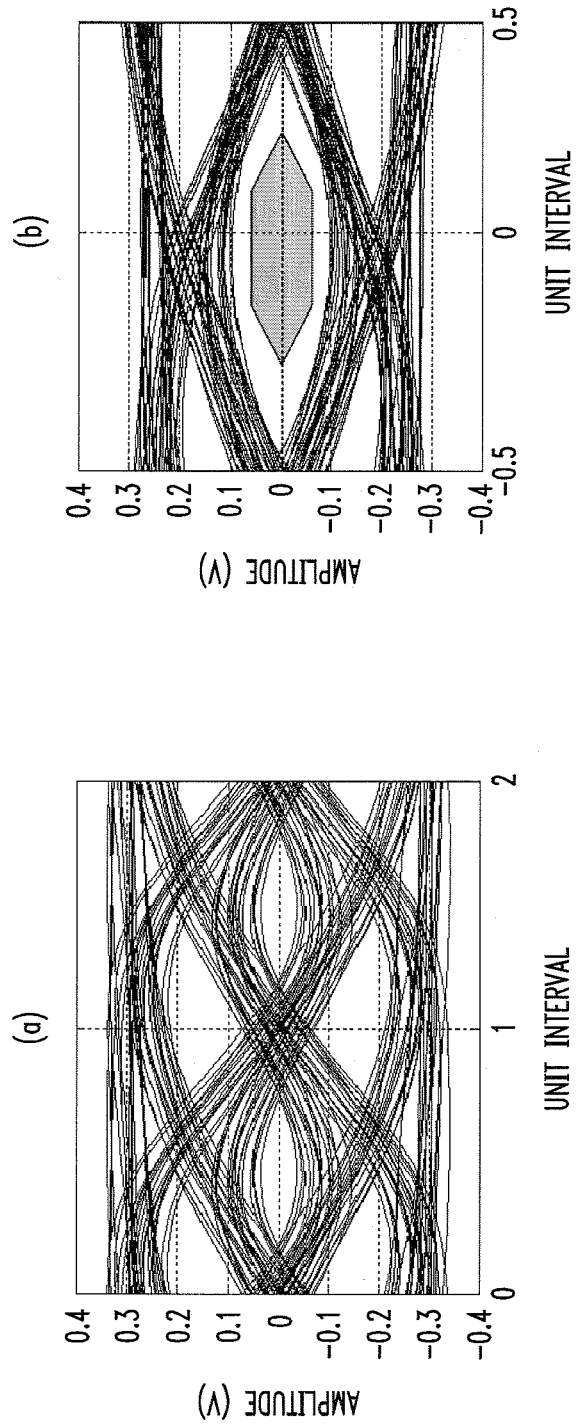
FIG. 20 shows a third eye masking test case according to an embodiment of the invention.

FIG. 20 shows a third eye masking test example. Case #3 assumes a TX setting type #2 and a channel type #2. Re-tuning TX pre-emphasis settings results in: (i) the TX pre-emphasis is now programmed just enough for the SoftRX equalizers to open up the eye and meet the RX internal eye mask; and (ii) the TX amplitude and pre-emphasis level makes sure that minimum power is consumed and minimum cross-talk effect is exerted into the system.

In accordance with illustrative embodiments of the invention, as described in detail herein, many advantages are realized in the system optimization of communication devices that may be tested using eye masking techniques. That is, one or more illustrative embodiments provide an efficient method to perform in-situ system optimization based on the concept of soft receiver masking. Since this method does not rely on 10 GBASE-KR or any other proprietary protocol, it can be extended to all serial bus applications. With the SoftRX(soft receiver) approach, one can quickly explore the design trade-offs between the RX and TX equalization capabilities. Consequently, equalization load is distributed to maximize system performance. The soft receiver masking technique accounts for a wide variety of PVT conditions, for which conventional in-system tuning can not compensate. Therefore, the soft receiver masking technique provides a more reliable means for critical system tuning. The masking technique provides a fast and reliable means to for system calibration, especially suitable for production system tuning.

It is to be appreciated that, in an integrated circuit implementation of the invention, multiple integrated circuit dies are typically formed in a repeated pattern on a surface of a wafer. Each such die may include a device comprising circuitry as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for testing a communication device, comprising:
obtaining a software representation of a receiver portion of a given communication device, wherein the software representation is configured to simulate one or more receiver operations of the receiver portion of the given communication device;
processing a data signal received from a transmitter through a given link channel, wherein the processing step is performed via the software representation of the receiver portion of the communication device, and the processing step performs the one or more receiver operations simulated by the software representation of the receiver portion of the given communication device;
generating an output signal as a result of the processing step; and
applying an eye mask test to the output signal.

2. The method of claim 1, further comprising the step of adjusting one or more parameters of the transmitter based on a result of the eye mask test.

3. The method of claim 2, wherein at least one of the one or more parameters of the transmitter comprises an amplitude control value.

4. The method of claim 2, wherein at least one of the one or more parameters of the transmitter comprises a pre-emphasis finite impulse response control value.

5. The method of claim 4, wherein the pre-emphasis finite impulse response control value comprises at least one of a main-cursor tap weight, a post-cursor tap weight, and a pre-cursor tap weight.

6. The method of claim 1, wherein the given link channel through which the data signal is received is part of a group of link channels.

7. The method of claim 6, wherein link channels are grouped based on at least one of: (i) one or more a physical characteristics of the link channels; and (ii) one or more frequency domain characteristics of the link channels.

8. A method for testing a communication device, comprising:
obtaining a software representation of a receiver portion of a given communication device;
processing a data signal received from a transmitter through a given link channel, wherein the processing step is performed using the software representation of the receiver portion of the communication device, in accordance with one or more receiver operations represented therein, to generate an output signal; and
applying eye mask test to the output signal;
wherein the given link channel through which the data signal is received is part of a group of link channels;
wherein link channels are grouped based on at least one of: (i) one or more a physical characteristics of the link channels; and (ii) one or more frequency domain characteristics of the link channels;
wherein the one or more frequency domain characteristics of the link channels comprise at least one of insertion loss and return loss, which are obtained from S-parameter measurement of attenuation and reflection parameters, respectively.

9. The method of claim 7, wherein the one or more physical characteristics of the link channel comprise at least one of a channel length, a material type, and a trace layout.

10. The method of claim 1, further comprising the step of capturing the data signal after the data signal is output from the given data channel.

11. The method of claim 10, wherein the data signal is captured via a data signal capture device which saves a representation of the data signal as a function of voltage values and time values.

12. The method of claim 11, wherein the data signal is captured for a selected data point in an optimization parameter space of the transmitter.

13. The method of claim 12, wherein a separate capture step is performed for each data point in the optimization parameter space of the transmitter and for each link channel in a group of link channels that contains the given link channel.

14. The method of claim 1, wherein the eye mask test comprises determining a pass or fail result for the given link channel for a given test data point for a given transmitter parameter.

15. The method of claim 14, wherein, for the given channel, a combination of results from each test data point generates a passing zone.

16. The method of claim 15, further comprising comparing passing zones from each link channel of a group of link channels.

17. The method of claim 16, wherein a transmitter parameter setting that satisfies each link channel of the group of link channels defines an optimal transmitter parameter setting for the group of link channels.

18. The method of claim 1, wherein the eye mask test further comprises comparing an eye diagram, generated for the output signal that is generated by the software representation of the receiver portion of the communication device, with a pre-defined eye mask.

19. The method of claim 18, wherein the eye mask comprises a receiver-internal eye mask.

20. An apparatus for testing a communication device, comprising:
a memory; and
a processor coupled to the memory and configured to: (i) process a data signal received from a transmitter through a given link channel, wherein the processing step is performed via a software representation of a receiver portion of the communication device, wherein the software representation is configured to simulate one or more receiver operations of the receiver portion of the given communication device and the processing step performs the one or more receiver operations simulated by the software representation of the receiver portion of the communication device; (ii) generate an output signal as a result of the processing step; and (iii) apply an eye mask test to the output signal.

21. The apparatus of claim 20, wherein the processor is further configured to cause an adjustment of one or more parameters of the transmitter based on a result of the eye mask test.

22. The apparatus of claim 20, wherein the eye mask test comprises determining a pass or fail result for the given link channel for a given test data point for a given transmitter parameter.

23. The apparatus of claim 22, wherein, for the given channel, a combination of results from each test data point generates a passing zone.

24. The apparatus of claim 23, wherein the processor is further configured to compare passing zones from each link channel of a group of link channels.

25. The apparatus of claim 24, wherein a transmitter parameter setting that satisfies each link channel of the group of link channels defines an optimal transmitter parameter setting for the group of link channels.

26. A system for testing a communication device, comprising:
a data signal capture device for capturing a data signal received from a transmitter through a given link channel; and
a computing system coupled to the data signal capture device and configured to: (i) process the captured data signal via a software representation of a receiver portion of the communication device, wherein the software representation is configured to simulate one or more receiver operations of the receiver portion of the given communication device and the processing step performs the one or more receiver operations simulated by the software representation of the receiver portion of the communication device; (ii) generate an output signal as a result of the processing step; and (iii) apply an eye mask test to the output signal.

27. The system of claim 26, wherein the computing system is further configured to cause an adjustment of one or more parameters of the transmitter based on a result of the eye mask test.

* * * * *